United States Patent
Shimizu et al.

(10) Patent No.: US 6,426,173 B1
(45) Date of Patent: Jul. 30, 2002

(54) PREPARATION METHOD FOR PRINTING PLATE

(75) Inventors: Shinji Shimizu, Tatebayashi; Yasuhiko Kojima, Konosu; Koji Oe, Kitamoto, all of (JP)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/647,084

(22) Filed: Sep. 22, 2000

(30) Foreign Application Priority Data

Jan. 22, 1999 (JP) .......................... 11-014190
Jan. 20, 2000 (JP) ........................ 2000-012261

(51) Int. Cl.[7] .................... G03F 7/30; G03F 7/021; G03F 7/023; G03F 7/028
(52) U.S. Cl. ................. 430/302; 430/157; 430/162; 430/165; 430/175; 430/192; 430/303; 430/945; 430/281.1
(58) Field of Search ............... 430/302, 303, 430/157, 162, 175, 165, 192, 281.1, 945

(56) References Cited

U.S. PATENT DOCUMENTS

| | | | |
|---|---|---|---|
| 5,340,699 A | 8/1994 | Haley et al. | 430/302 |
| 5,559,824 A | * 9/1996 | Baird et al. | 372/102 |
| 5,631,119 A | * 5/1997 | Shinozaki | 430/166 |
| 5,658,708 A | 8/1997 | Kondo | 430/288.1 |
| 5,663,037 A | 9/1997 | Haley et al. | 430/178.1 |
| 5,731,123 A | 3/1998 | Kawamura et al. | 430/176 |
| 5,773,194 A | * 6/1998 | Hattori et al. | 430/278.1 |
| 5,885,746 A | 3/1999 | Iwai et al. | 430/280.1 |

FOREIGN PATENT DOCUMENTS

| | | |
|---|---|---|
| JP | 7325391 | 12/1995 |
| JP | 8194317 | 7/1996 |
| JP | 8248639 | 9/1996 |
| JP | 8248640 | 9/1996 |
| JP | 8314132 | 11/1996 |
| JP | 10301296 | 11/1996 |
| JP | 9171254 | 6/1997 |
| JP | 9197668 | 7/1997 |
| JP | 9211652 | 8/1997 |
| JP | 9211863 | 8/1997 |
| JP | 9211865 | 8/1997 |
| JP | 9222731 | 8/1997 |
| JP | 9304931 | 11/1997 |
| JP | 10293405 | 11/1998 |
| JP | 10319602 | 12/1998 |
| JP | 11015144 | 1/1999 |

* cited by examiner

Primary Examiner—John S. Chu
(74) Attorney, Agent, or Firm—BakerBotts L.L.P.

(57) ABSTRACT

The present invention relates to a planographic printing plate employed in the field of offset printing, and more particularly, to a preparation method for a printing plate employing a conventional planographic printing original plate with a novel light source. In this method, an image is formed to a planographic printing original plate, in which at least one photosensitive layer sensitive in the region of 300 nm~450 nm is provided on a substrate, by scan irradiating the plate with high density energy light in the form of the image, and then performing wet development and a post-treatment. This preparation method for the printing plate is characterized in that the output wavelength of the high density energy light is within the range of 300 nm or more, but less than 370 nm, and the high density energy light is high density energy light of the second or third harmonic obtained from a solid-state semiconductor or a solid-state exited by semiconductor. By means of this method, it is possible for an image to be directly drawn stably and at low cost to a conventional planographic printing original plate that was manufactured for an application with active rays, by employing high density energy light that is scan irradiated according to digital information. As a result, high resolution images can be reproduced easily.

25 Claims, No Drawings

PREPARATION METHOD FOR PRINTING PLATE

CROSS-REFERENCE TO RELATED APPLICATIONS

This application claims priority from PCT/JP00/00312 filed on Jan. 24, 2000, which in turn claims priority from Japanese Patent Application Nos. 11–014190 filed on Jan. 22, 1999 and 2000–012261 filed on Jan. 20, 2000.

BACKGROUND OF THE INVENTION

1. Field of the Invention

The present invention relates to a planographic printing plate employed in the field of offset printing, and more specifically, to a preparation method for the printing plate that employs a novel light source with a conventional planographic printing original plate. This application claims priority from and is based on PCT application No. PCT/JP00/00312 filed on Jan. 24, 2000, which in turn claims priority from patent applications filed in Japan (Japanese Patent Application No. 11-14190 filed on Jan. 22, 1999 and No. 2000-12261 filed on Jan. 24, 2000), the contents of which are incorporated herein by reference.

2. Background Information

In the conventionally employed method for preparing the planographic printing plates that are used in offset printing, a film on which an image is already formed is adhered to a conventional planographic printing original plate in which at least one photosensitive layer has been provided on a substrate. The image is then transferred onto the conventional planographic printing original plate by flood exposure with active rays. The printing plate is then obtained following wet developing, post-treating and drying steps. A mercury lamp, metal halide lamp, xenon lamp, chemical lamp, or carbon arc lamp may be cited as examples of the light source of active rays that are employed here. The photosensitive layer of the conventional planographic printing original plate is designed to be sensitive to 300~450 nm light, corresponding to the output wavelength of these light sources. However, the sensitivity of the photosensitive layer in the conventional planographic printing original plate is extremely low as compared to other photosensitive materials such as silver film and the like. Accordingly, irradiation with active rays may require from a few seconds to several minutes using flood exposure. Accordingly, there had not been a means for directly drawing digital information to this type of conventionally known planographic printing original plate.

Image information has been shifting from analog to digital data in recent years, however, accompanying developments in the information industry. In response to this trend, new technology has been developed to draw the digital information from a computer directly on to a planographic printing original plate, and then carry out a post-treatment to make a printing plate. This new technology includes high sensitivity PS plates that employ an argon gas laser (488/514 nm) or the second harmonic (532 nm) of a YAG solid-state semiconductor laser, i.e., a green laser, as a high density energy light source. Specific product examples include the LA-2 and LY-2 manufactured by Mitsubishi Chemical Corp., and the Brillia LP-N made by Fuji Photo Film Co., Ltd. Examples of relevant references include Japanese Patent Application, First Publication No. 7-325391; Japanese Patent Application, First Publication No. 8-240908; Japanese Patent Application, First Publication No. 8-248639, and Japanese Patent Application, First Publication No. 8-248640, among others.

Specific examples of thermal planographic printing original plates that employ various types of solid state semiconductor lasers having an excitation wavelength in the range of 800~1200 nm, i.e., infrared lasers, as a high density energy light source include the DITP and Electra DC by Kodak Polychrome Graphics Company Ltd., the LT-1 and LT-G by Mitsubishi Chemical Corp., and the LH-PI and LH-NI by Fuji Photo Film Co., Ltd. Relevant references include Japanese Patent Application, First Publication No. 7-20629; Japanese Patent Application, First Publication No. 7-271029; Japanese Patent Application, First Publication No. 8-220752; Japanese Patent Application, First Publication No. 8-234426; Japanese Patent Application, First Publication No. 9-171254; Japanese Patent Application, First Publication No. 9-197668; Japanese Patent Application, First Publication No. 9-211863; Japanese Patent Application, First Publication No. 9-211865; Japanese Patent Application, First Publication No. 9-221652; Japanese Patent Application, First Publication No. 9-222731; Japanese Patent Application, First Publication No. 9-304931, among others.

In the preparation method for a planographic printing original plate using these high density energy light sources, drawing of the image is accomplished by contracting the light beam so that the diameter of the surface irradiated with the high density energy light in a lens or other such optical system is reduced to several to 20 micrometers, and then scanning the light beam over the planographic printing original plate based on the digital information. The irradiating time per spot is from several milliseconds to 20–30 nanoseconds. The energy on the plate surface ranges from 100 mJ/cm$^2$ to several 100 mJ/cm$^2$. Following drawing of the image, the steps of wet developing, post-treating and drying are carried out in the same way as in the case of a conventional planographic printing original plate employing the light source of active rays, to obtain the printing plate.

Planographic printing original plates that use high density energy light source employ different techniques and materials from those used in conventional planographic printing original plates that use the light source of active rays. Namely, in order to use high density energy light source, these planographic printing original plates employ such materials as pigments or dyes with an absorption region at 450 nm or more as a substance that generates heat upon absorbing light corresponding to the excitation wavelength of such high density energy light, and such techniques as adding acid generator or measures against high intensity law failure. For this reason, it is not possible to draw an image using a high density energy light source in the range of 300~450 nm to a planographic printing original plate that employs such high density energy light source in the range of 450 nm or more.

Japanese Patent Application, First Publication No. 8-194317 discloses a technique for directly drawing digital information to a conventional planographic printing original plate using an argon ion laser that has a wavelength in the range of 320~400 nm as the high density energy light.

However, these types of gas lasers are problematic with respect to stability. In addition, practical use of such lasers is difficult due to the requirement for a large cooling device. Such gas lasers are also expensive, and therefore have not been economical.

Japanese Patent Application, First Publication No. 10-293405 discloses a technique for directly drawing digital information to a conventional planographic printing original plate using second harmonic laser light with an output wavelength in the range of 400~450 nm that is obtained from a semiconductor laser that has a fundamental wavelength of 800~900 nm.

Japanese Patent Application, First Publication No. 10-301296 discloses a technique for directly drawing digital information to a conventional planographic printing original plate using second harmonic laser light with an output wavelength in the range of 370~480 nm that is obtained from a semiconductor laser having a fundamental wavelength of 740~960 nm.

Japanese Patent Application, First Publication No. 10-319602 discloses a technique for directly drawing digital information to a conventional planographic printing original plate using second or third harmonic laser light with an output wavelength of 400 nm or more that is obtained from a semiconductor laser.

Japanese Patent Application, First Publication No. 11-15144 discloses a technique for directly drawing digital information to a conventional planographic printing original plate using second harmonic laser light with an output wavelength in the range of 370~480 nm that is obtained from a semiconductor laser having a fundamental wavelength of 740~960 nm.

Lasers in the 370 nm~480 nm wavelength region are not capable of transmitting power that consistently reproduces the image with high resolution. For this reason, in the technique disclosed in Japanese Patent Application, First Publication No. 10-293405, it is necessary to compensate for the laser light's insufficient output by also using flood exposure in addition to scanning exposure by the laser light. Similarly, in the technique disclosed in Japanese Patent Application, First Publication No. 10-301296, it is necessary to compensate for the laser light's insufficient output by performing a scanning exposure using the laser light, followed by a cross-linking reaction treatment after development.

It is therefore the objective of the present invention to provide a preparation method for a printing plate that can use high density energy light, which is scan irradiated according to digital information, to directly draw an image at low cost and with stability to a conventional planographic printing original plate that was prepared for an application using active rays, this method enabling a high resolution image to be readily reproduced.

SUMMARY OF THE INVENTION

The present inventors completed this invention with the discovery that, when high output blue laser light which had been recently developed is applied to a conventional planographic printing original plate that uses the light source of active rays, it was possible to obtain an excellent printing plate from performing image drawing and post-treatment, even if no special high density energy light strategy is used.

Namely, in the preparation method for a printing plate of the present invention, an image is formed to a planographic printing original plate, in which at least one photosensitive layer sensitive in the region of 300 nm~450 nm is provided on a substrate, by scan irradiating the plate with high density energy light in the form of the image. Wet development and a post-treatment are then carried out to form the printing plate. This method is characterized in that the output wavelength of the high density energy light is within the range of 300 nm or more, but less than 370 nm, and is high density energy light of the second or third harmonic obtained from a solid-state semiconductor such as a solid-state semiconductor laser or a semiconductor excited solid body such as an optically pumped semiconductor laser. As a result of this type of printing plate preparation method, it is possible to directly draw an image with stability and at low cost by scan irradiating a conventional planographic printing original plate, that was prepared for application using active rays, with high density energy light based on digital information, and to readily reproduce a high resolution image.

DETAILED DESCRIPTION OF THE INVENTION

The preparation method for a printing plate of present invention is characterized in employing high density energy light having an output wavelength in the range of 300 nm or more, but less than 370 nm, i.e., a so-called blue laser light, as the light source for drawing the image. This high output blue laser light can be obtained by rendering the fundamental wavelength of a solid-state semiconductor such as a solid-state semiconductor laser or a semiconductor excited solid body such as an optically pumped semiconductor laser as a second or third harmonic through use of a modulating crystal.

When the wavelength of the blue laser light is less than 300 nm, this may fall outside the region of photosensitivity of a planographic printing original plate according to the conventional technology. Accordingly, wavelengths of less than 300 nm are not desirable from the perspective of practical application. When the wavelength of the blue laser light exceeds 370 nm, then laser light of an output that will cause a sufficient chemical reaction to obtain the planographic printing plate cannot be achieved.

Further, laser light of a sufficient output cannot be obtained from blue laser light from a solid-state semiconductor having a fundamental wavelength in the range of 300~370 nm, i.e., from high density energy light that is not a second or third harmonic obtained from a solid-state semiconductor such as a solid-state semiconductor laser or a semiconductor excited solid body such as an optically pumped semiconductor laser.

Examples of this type of high output blue laser light include high output blue laser light in the form of a second harmonic of a solid-state semiconductor laser or optically pumped semiconductor laser having a fundamental wavelength of 600 nm or more but less than 740 nm; and high output blue laser light in the form of a third harmonic of a solid-state semiconductor laser or optically pumped semiconductor laser having a fundamental wavelength of 900 nm or more, but less than 1110 nm. Various types of lasers may be cited as examples of this type of solid-state semiconductor, including GaAlAs/GaAs, InGaAsP/InP, InGaP/InGaAlP/GaAs, YAG, Nd:YAG exited by Laser Diode, Nd:YLF excited by Laser Diode, and the like. Any of these may be employed as a solid-state semiconductor laser or optically pumped semiconductor laser for the blue laser light source in the present invention. The output of the blue laser light source employed in the present invention must have a power of 300 mW or more, and preferably, 1 W or more.

Specific examples of high output blue laser light sources that are commercially available and can be employed in the present invention include Compass Avia (wavelength: 355 nm, third harmonic, output: 1.5 W, manufactured by Coherent Japan Inc.), Quantronix (wavelength: 351 nm, third harmonic, output: 3 W . manufactured by OptoFocus Corporation), Quantronix (wavelength: 355 nm, third harmonic, output: 3 W, manufactured by OptoFocus Corporation), and Light Book (wavelength: 355 nm, third harmonic, output: 5 W, manufactured by Marubun Corporation). The present invention is not limited to these however.

The light generated by the laser generator may be continuous or pulsed. Typically, an optical system employing glass is used to contract the generated light so that the exposure area on the surface of the planographic printing original plate is from several micrometers to 20 micrometers in size.

Various methods are available for scanning over the surface of the planographic printing original plate using an optical system. These include a method in which a multi-channel light source head is moved from the outside of a rotating drum, and a method employing a polygon which scans the inside of a rotating drum or the horizontal head. All of these are available from specialized manufacturers in the form of devices in which the entire exposure scanning is a unitary process.

Conventional laser light having a wavelength region in the range of 370 nm~480 nm is not sufficient for forming an image for planographic printing. The second or third harmonic high output blue laser light having an output wavelength in the range of 300 nm or more, but less than 370 nm which is employed in the present invention enables a high resolution image to be reproduced easily without performing additive supplementary exposure. Moreover, the high output blue laser light in the present invention is advantageous in terms of its stability and low cost as compared to conventional gas lasers.

An explanation will now be made of planographic printing original plates for which the present invention is applicable. Namely, in these planographic printing original plates, at least one photosensitive layer for the active rays is provided on a substrate, this layer having a photosensitive region in the range of 300~450 nm. In addition, at least one or more types of photosensitive material, having a photosensitive region in the range of 300~450 nm, are included in the photosensitive layer. The methods employed by the present invention for preparing printing plates by exposing an image on a conventional planographic printing original plate, and then carrying out wet development and post-treatment, will be explained with the separate applications.

A negative photosensitive planographic printing original plate (hereinafter referred to as "negative PS plate") is available for use as the conventional planographic printing original plate to which the present invention is applied, in which the printing plate image is formed by applying active rays and then becoming insoluble in an alkaline developing solution.

In a negative PS plate, one or more photosensitive layers are provided on a substrate in which the surface has been made hydrophilic. Representative examples of compositions that are included in this photosensitive layer include: (1) a photosensitive composition consisting of a photosensitive diazo resin and a binder resin; (2) a photosensitive composition that includes a photo cross-linking resin; and (3) a photosensitive composition that includes an addition polymerizable unsaturated compound and a photopolymerization initiator.

(1) Examples of the photosensitive diazo resin present in the photosensitive composition consisting of a photosensitive diazo resin and a binder resin include diazo resins represented by the salt of the condensation product of diazodiarylamine and active carbonyl compound. A resin that is insoluble in water but soluble in an organic solvent is preferred. Particularly optimal diazo resins include organic acid salts and inorganic acid salts of condensates between 4-diazodiphenylamine, 4-diazo-3-methyldiphenylamine, 4-diazo-4'-methyldiphenylamine, 4-diazo-3'-methyldiphenylamine, 4-diazo-3-methyl-4'-ethoxydiphenylamine, and 4-diazo-3-methoxydiphenylamine or the like, and formaldehyde, paraformaldehyde, acetoaldehyde, benzaldehyde, and 4,4'-bis(methoxymethyl)diphenyl ether or the like. Examples of organic acid salts include methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, 2-hydroxy-4-methoxybenzophenone-5-sulfonic acid, 2,4-dihydroxybenzophenone, benzenephosphinic acid, or the like. Examples of inorganic acids include hexafluorophosphoric acid, tetrafluoroboric acid, and the like.

Other examples of photosensitive diazo resins include a diazo resin having a polyester group on the main chain as disclosed in Japanese Patent Application, First Publication No. 54-30121; a diazo resin formed by reacting a diazo compound having a hydroxyl group on a polymer that has a carboxylic acid anhydride residue as disclosed in Japanese Patent Application, First Publication No. 61-273538; or a diazo resin formed by reacting a diazo compound having a hydroxyl group in a polyisocyanate compound. Examples of the binder resin include (meth)acrylic acid (hereinafter acrylic acid and methacrylic acid will be referred to more generally as "(meth)acrylic acid")-(meth)acrylic acid ester copolymer; a copolymer containing hydroxyalkyl(meth) acrylate and (meth)acrylonitrile having an acid value of 10~100 as disclosed in U.S. Pat. No. 4,123,276; a copolymer having an aromatic hydroxyl group as disclosed in Japanese Patent Application, Second Publication No. 57-43890; a copolymer such as polymers that have 2-hydroxy-3-phenoxypropyl(meth)acrylate units, or the like as disclosed in Japanese Patent Application, Second Publication No. 57-51656; epoxy resin; polyamide resin; polyvinyl halogens, particularly, polyvinyl chloride; polyvinylidene chloride; polyvinyl acetate; polyester; acetal resins such as formal resin and butyral resin; a soluble polyurethane resin marketed by the U.S. company B. F. Goodrich under the commercial name Estane; polystyrene; copolymers of styrene and maleic acid anhydride, or half-esters thereof; cellulose derivatives; shellac; and rosin or modified thereof.

(2) A photo cross-linking resin with affinity for an aqueous alkali developing solution is preferred as the photo cross-linking resin in the photosensitive composition that includes a photo cross-linking resin, examples thereof including a copolymer having a carboxyl group and a cinnamic acid group as disclosed in Japanese Patent Application, Second Publication No. 54-15711; a polyester resin having a carboxyl group and a phenylene diacrylic acid residue as disclosed in Japanese Patent Application, First Publication No. 60-165646; a polyester resin having a phenolic hydroxyl group and a phenylene diacrylic acid residue as disclosed in Japanese Patent Application, First Publication No. 60-203630; a polyester resin having sodium iminodisulfonyl group and phenylene diacrylic acid residue as disclosed in Japanese Patent Application, Second Publication No. 57-42858; and a polymer having a carboxyl group and an azide group on a side chain as disclosed in Japanese Patent Application, First Publication No. 59-208552; and the like.

(3) Examples of the photosensitive composition containing a photopolymerization initiator and an addition polymerizable unsaturated compound include a composition comprising a photopolymerization initator and an addition polymerizable unsaturated compound having two or more terminal ethylene groups, as disclosed in U.S. Pat. No. 2,760,863, U.S. patent application Ser. No. 3,060,023, and Japanese Patent Application, First Publication No. 62-121448, for example. In addition, the binder resins disclosed under (1) above, a copolymer having an unsaturated group on a side chain as disclosed in Japanese Patent Application, First Publication No. 61-285449, and the like may be employed as a binder resin.

In addition, pigments, dyes, stabilizers, fillers, cross-linking agents and the like may be added to the aforementioned negative photosensitive composition as needed. These components are dissolved in a suitable solvent, coated onto a substrate, the surface of which has been made hydrophilic, and then dried to obtain a photosensitive layer that is typically 0.5~5 $g/m^2$.

In addition to a negative photosensitive layer, it is also acceptable to provide a protective layer or an intermediate layer which is provided between the photosensitive layer and the substrate in this negative PS plate.

Examples of a base for the negative PS plate include metal plates such as aluminum, zinc, copper, stainless steel, or iron plates; plastic films such as polyethylene terephthalate, polycarbonate, polyvinylacetal, or polyethylene; or a composite material in which vacuum deposition or lamination is used to provide a metal layer onto a plastic film or paper that has been melt-coated with a synthetic resin or coated with a synthetic resin solution. Of these, aluminum or a composite supporting member covered with aluminum are particularly desirable.

It is preferable to treat the surface of the aluminum substrate with the goal of increasing water retentivity and improving adhesion with the photosensitive layer. For example, various surface roughing methods may be cited, including brush graining, ball graining, electrochemical etching, chemical etching, liquid honing, and sandblasting. A combination of these may also be used. A surface roughing method that includes the use of electrochemical etching is particularly preferred. An aqueous solution including acid, alkali, or salts thereof, or an water base solution including an organic solvent may be employed for the electrolytic bath used during electrochemical etching. Of these, an electrolytic solution that includes hydrochloric acid, nitric acid, or salts of these is preferred. In addition, an aluminum plate that has been subjected to a surface roughing treatment is desmut treated in an aqueous solution of an acid or alkali as needed. The thus-obtained aluminum plate is preferably subjected to an anodizing treatment, with a method being preferred in which the plate is treated in a bath that includes sulfuric acid or phosphoric acid.

It is also acceptable to carry out as necessary the silicate treatment (sodium silicate, potassium silicate) disclosed in U.S. Pat. Nos. 2,714,066 and 3,181,461; the potassium fluorozirconate treatment disclosed in U.S. Pat. No. 2,946,638; the phosphomolybdate treatment disclosed in U.S. Pat. No. 3,201,247; the alkyl titanate treatment disclosed in U.K. Patent No. 1,108,559; the polyacrylic acid treatment disclosed in German Patent No. 1,091,433; the polyvinyl phosphonic acid treatment disclosed in German Patent No. 1,134,093 and U.K. Patent No. 1,230,447; the phosphonic acid treatment disclosed in Japanese Patent Application, Second Publication No. 44-6409; the phytic acid treatment disclosed in U.S. Pat. No. 3,307,951; the treatment using the salt of a bivalent metal and a hydrophilic organic macromolecular compound as disclosed in Japanese Patent Application, First Publication No. 58-16893 and Japanese Patent Application, First Publication No. 58-18219; a hydrophilizing treatment by priming an aqueous polymer having a sulfonic acid group as disclosed in Japanese Patent Application, First Publication No. 59-101651; coloring using acidic dyes as disclosed in Japanese Patent Application, First Publication No. 60-64352; silicate electrodeposition as disclosed in U.S. Pat. No. 3,658,662; among others. In addition, it is preferable to carry out a sealing treatment following the graining and anodizing treatments. This sealing treatment may be carried out by employing a steam bath, or by soaking in hot water or a hot aqueous solution that includes an inorganic salt or organic salt.

The negative printing plate that is employed in the present invention can be produced by coating a negative photosensitive composition layer onto a substrate that has had its surface subjected to a hydrophilizing treatment by a conventional technique, and then drying this layer. Examples of coating methods include a rotating coating method, wire bar coating method, dip coating method, air knife coating method, roll coating method, blade coating method, curtain coating method, and spray coating method. The negative photosensitive composition layer coated in this way is dried using a warm air dryer or infrared dryer for 30 seconds to 10 minutes at 40~150° C.

The present invention does not rely on active rays to perform image drawing to a negative PS plate prepared by these methods, but rather uses scan irradiation with a high output blue laser that has a wavelength in the range of 300 nm or more, but less than 370 nm. A printing plate is then formed by carrying out development using an alkaline developing solution and a desensitizing treatment.

Examples of alkali agents used in the alkaline aqueous developing solution for the negative employed in the developing treatment include inorganic alkali agents such as sodium silicate, potassium silicate, potassium hydroxide, sodium hydroxide, lithium hydroxide, sodium secondary phosphate, sodium tertiary phosphate, ammonium secondary phosphate, ammonium tertiary phosphate, sodium metasilicate, sodium carbonate, ammonia or the like; and organic amine compounds such as mono-, di-, or trimethylamine, mono-, di-, or triethylamine, mono- or diisopropylamine, n-butylamine, mono-, di-, or triethanol amine, mono-, di-, or triisopropanolamine, ethyleneimine, ethylenediimine, and the like. The amount of these alkali agents included in the developing solution is in the range of 0.005~10 wt %, and preferably 0.05~5 wt %. When the amount is less than 0.05 wt %, underdevelopment results, while when the amount exceeds 10 wt %, deleterious effects result such as penetration to the negative photosensitive image forming layer.

An organic solvent may be added to the developing solution for the negative. Specific examples include ethyl acetate, propyl acetate, butyl acetate, amyl acetate, benzyl acetate, ethyleneglycol monobutylacetate, butyl lactate, butyl levulinate, ethylbutylketone, methylisobutylketone, cyclohexanone, ethyleneglycol monobutyl ether, ethyleneglycol benzyl ether, ethyleneglycol monophenyl ether, benzyl alcohol, methylphenyl carbinol, n-amyl alcohol, methylamyl alcohol, xylene, methylene dichloride, ethylene dichloride, monochlorobenzene, and the like. These organic solvents are included in the negative developing solution in the amount of 20 wt % or less, and preferably 10 wt % or less.

In addition, various agents may be added to the negative developing solution as necessary, including aqueous sulfites like lithium sulfite, sodium sulfite, potassium sulfite, and magnesium sulfite; hard water softening agents such as alkali-soluble pyrazolone compounds, alkali-soluble thiol compounds, hydroxy aromatic compounds like methyl resorcinol, polyphosphates, and aminopolycarbonic acids; anionic or ampholytic surface active agents such as sodium isopropylnapthalene sulfonate, sodium n-butylnapthalene sulfonate, sodium N-methyl-N-pentadecylaminoacetate, and sodium lauryl sulfite; defoaming agents; and the like.

The negative PS plate is developed at a temperature of 15~40° C., for 1 second to 2 minutes, with the exposed negative PS plate soaked in the developing solution and then washed. The surface of the plate may be lightly rubbed as necessary.

A negative PS plate which has completed the developing treatment is then subjected to washing and/or a treatment with an aqueous desensitizer. Examples of aqueous desensitizer include aqueous solutions such as aqueous natural macromolecules like arabic gum, dextrin, and carboxymethylcellulose, and aqueous synthetic macromolecules like polyvinyl alcohol, polyvinyl pyrolidone, and polyacrylic acid. Further, as necessary, acids or surface active agents may be added to these aqueous desensitizer. Following the desensitizing treatment, drying is carried out and the resulting plate is then used as a printing plate in printing. It is effective to employ an automatic processor filled with developing solution and desensitizer which can perform the steps of development, washing, desensitizing and drying at one time in a continuous manner. Accordingly, use of such a device is desirable.

Other conventional planographic printing original plates in which the present invention is suitably applied include a positive photosensitive planographic printing original plate (hereinafter referred to as "positive PS plate") in which the printing plate image is formed by applying active rays and becoming soluble in the alkali developing solution.

A positive PS plate is designed such that one or more photosensitive layers are provided on a substrate, the surface of which has been made hydrophilic. Representative examples of compounds that are included in the photosensitive layer include o-quinone diazide compounds, acid-decomposable ether compounds, acid-decomposable ester compounds and the like. Specific examples of o-quinone diazide compounds include those cited in Japanese Patent Application, First Publication No. 47-5303, Japanese Patent Application, First Publication No. 48-63802, Japanese Patent Application, First Publication No. 48 -63803, Japanese Patent Application, First Publication No. 49-38701, Japanese Patent Application, First Publication No. 56-1044, Japanese Patent Application, First Publication No. 56-1045, Japanese Patent Application, Second Publication No. 41-11222, Japanese Patent Application, Second Publication No. 43-28403, Japanese Patent Application, Second Publication No. 45-9610, Japanese Patent Application, Second Publication No. 49-17481, U.S. Pat. Nos. 2,797,213, 3,046,120, 3,188,210, 3,454,400, 3,544,323, 3,573,917, 3,674,495, 3,785,825, U.K. Patent No. 1,227,602, U.K. Patent No. 1,251,345, U.K. Patent No. 1,267,005, U.K. Patent No. 1,329,888, U.K. Patent No. 1,330,932, and German Patent No. 854,890, among others.

Examples of acid-decomposable compounds include the compounds disclosed in Japanese Patent Application, First Publication No. 60-37549, Japanese Patent Application, First Publication No. 60-10247, and Japanese Patent Application, First Publication No. 60-3625.

The present invention can at least be desirably applied to a photosensitive material that employs these compounds alone or in combination as a photosensitive component. o-quinone diazide carboxylic acid esters of aromatic hydroxy compounds, and o-quinone diazide sulfonic acids or o-quinone diazide carboxylic acid amides of aromatic amino compounds may be included in these photosensitive components. In addition, these photosensitive components may include a compound in which these o-quinone diazide compounds are used alone, or a compound in which these o-quinone diazide compounds are mixed with an alkali soluble resin, and this mixture is provided as the photosensitive layer.

Resins consisting of a novolak phenol resin and/or a polyvinyl phenol resin may be used in the alkali soluble resin. Examples of novolak resins include the products obtained as a result of a condensation reaction in the presence of an acidic catalyst between at least one type of aromatic hydrocarbon, such as phenol, m-cresol, o-cresol, p-cresol, 2,5-xylenol, 3,5-xylenol, resorcinol, pyrogallol, bisphenol, bisphenol A, trisphenol, o-ethylphenol, m-ethylphenol, p-ethylphenol, propylphenol, n-butylphenol, t-butylphenol, 1-naphthol, or 2-naphthol; and at least one aldehyde or ketone selected from the group comprising aldehydes such as formaldehyde, paraformaldehyde, acetoaldehyde, paraldehyde, propionaldehyde, benzaldehyde, and furfural, and ketones like acetone, methylethylketone, and methylisobutylketone.

The product of a condensation reaction between at least one type of aromatic hydrocarbon selected from phenols like phenol, m-cresol, o-cresol, p-cresol, 2,5-xylenol, 3,5-xylenol, or resorcinol, and at least one type of aldehyde selected from aldehydes like formaldehyde, paraformaldehyde, acetoaldehyde, paraldehyde, or propionaldehyde, is particularly desirable for use as a preferable novolak resin.

The molecular weight of the novolak resin is such that the weight average molecular weight expressed in terms of polystyrene measured using gel permeation chromatography is in the range of 1,000~15,000, and preferably 1,500~10,000.

Examples of polyvinyl phenol resins include a polymer or copolymer of one or more hydroxystyrenes such as o-hydroxystyrene, m-hydroxystyrene, p-hydroxystyrene, 2-(o-hydroxyphenyl)propylene, 2-(m-hydroxyphenyl)propylene, and 2-(p-hydroxyphenyl)propylene. The hydroxystyrene may have a halogen atom such as chlorine, bromine, iodine, or fluorine, or a substitution group such as a low order alkyl group of 1–4C, present in the aromatic ring. Accordingly, suitable examples of the polyvinyl phenol resin are those which can have a halogen atom or a substitution group such as a low order alkyl group of 1–4C present in the aromatic ring.

Typically, the polyvinyl phenol resin is obtained by anaerobically polymerizing one or two or more types of hydroxystyrenes which can have substitute groups in the presence of a radical polymerization initiator or a cationic polymerization initiator. Hydrogen atoms may be added to a portion of the aforementioned polyvinyl phenol resin. A resin is also acceptable in which a portion of the OH groups in the polyvinyl phenol is protected with a t-butoxycarbonyl group, pyranyl group, furanyl group or the like. The weight average molecular weight of the polyvinyl phenol resin is in the range of 1,000~100,000, and preferably in the range of 1,500~50,000.

Additive agents such as pigments, dyes, plasticizers, components to enable print-out, surface active agents, solubility modifiers, coating auxiliary agents and the like may be added as necessary to the photosensitive layer employing an o-quinone diazide compound as a photosensitive component. These components are dissolved in a suitable solvent, and coated onto a substrate, the surface of which has been made hydrophilic, and then dried to form a photosensitive layer of 0.5~5 g/m$^2$ typically.

In addition to a positive photosensitive layer, it is also acceptable to provide a protective layer or an intermediate layer which is provided between the photosensitive layer and the substrate in the positive PS plate.

Substrates in which the surface has been subjected to the same hydrophilizing treatment as employed for a negative PS plate may be employed as the substrate for the positive PS plate. As in the case of the negative PS plate, preferred substrate include aluminum or a composite supporting member covered with aluminum.

The same method as employed for the negative PS plate may be used to treat the surface of the aluminum substrate, with a surface roughing method that includes the use of electrochemical etching being particularly preferred. As in the case of the negative PS plate, a desmuting treatment, anodizing treatment, other hydrophilizing treatment, graining treatment, sealing treatment or the like may be performed as necessary to the surface-roughened aluminum base.

The positive PS plate that is employed in the present invention can be produced by coating a positive photosensitive composition layer to a substrate that has had its surface subjected to a hydrophilizing treatment by a conventional technique, and then drying this layer. Examples of coating methods include a rotating coating method, wire bar coating method, dip coating method, air knife coating method, roll coating method, blade coating method, curtain coating method, and spray coating method. The positive photosensitive composition layer coated in this way is dried using a warm air dryer or infrared dryer for 30 seconds to 10 minutes at 40~150° C.

The present invention does not rely on active light rays to perform image drawing to a positive PS plate prepared by these methods, but rather uses scan irradiation with a high output blue laser that has a wavelength in the range of 300 nm or more, but less than 370 nm. A printing plate is then formed by performing a developing treatment using an alkaline developing solution and a desensitizing treatment.

An alkaline aqueous solution that does not substantially include an organic solvent is preferable as the developing solution for positive developing treatment in the present invention. Examples of the alkali agent include inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogencarbonate, ammonia or the like; and organic alkali agents such as tetraalkylammonium hydride, and the like. The concentration of these is in the range of 0.005~20 wt %, and preferably 0.01~5 wt %. As necessary, anionic, nonionic, cationic or ampholytic surface active agents, or surface active agents such as fluorine derived activators or silicon derived activators may be added.

The positive PS plate is developed at a temperature of 15~40° C., for 1 second to 2 minutes, with the exposed positive PS plate soaked in the developing solution and then washed. The surface of the plate may be lightly rubbed as necessary.

As in the case of the negative PS plate, a positive PS plate which has completed the developing treatment is then subjected to washing and/or a treatment with an aqueous desensitizer. Drying is then carried out and the resulting plate is used as a printing plate in printing. When carrying out the above-described plate preparation treatments, it is effective to employ an automatic processor filled with developing solution and desensitizer that can perform the steps of development, washing, desensitizing and drying at one time in a continuous manner. Accordingly, use of such a device is desirable.

Another conventional planographic printing original plate for which the present invention is applicable in which negative PS plate and positive PS plate technology is employed includes a negative PS plate for a negative/positive dual system and a two-sided PS plate. In the negative/positive dual system, a positive developing solution is employed. This system is assembled so that a negative PS plate, which is designed so that it can be developed in a positive developing solution, and a regular positive PS plate can be treated with the same positive developing solution. This system can be applied to the technology for preparing negative PS plates and/or positive PS plates, and a photosensitive region of negative PS plate for this system is the range of 300~450 nm. In the two-sided PS plate, a photosensitive layer is provided to both the front and rear surface of an aluminum substrate in a negative PS plate or a positive PS plate. The two-sided PS plate is applied to the technology described above, and a photosensitive region of this plate is the range of 300~450 nm.

A water less planographic printing original plate may be cited as another conventional planographic printing original plate in which the present invention can be applied. In this plate, a photosensitive layer, a silicon gum layer and a cover film layer are applied sequentially on an aluminum substrate. A photosensitive substance responsive to light in the 300~450 nm range is included in the photosensitive layer.

There are both negative and positive water less planographic printing original plates. These will be explained below separately.

o-naphthoquinone diazide sulfonic acid novolak ester is included as the photosensitive material in the photosensitive layer of a negative water less planographic printing original plate. The photosensitive layer and silicon gum layer are strongly fixed in place prior to exposure. The photosensitive material in the photosensitive layer undergoes photolysis upon exposure to active rays, causing a change in polarity. The cover film is removed following exposure, and the plate surface is wetted with the developing solution. The adhesiveness between the photosensitive layer and the silicon gum layer becomes weaker at a portion which has undergone a polarity change. The portion is developed by rubbing, so that only the silicon gum layer is removed. The printing plate is then obtained by drying.

A photopolymerizable photosensitive material that contains hydroxyl groups in the molecule is included in the photosensitive layer of a positive water less planographic printing original plate. Photopolymerizing and cross-linking in the exposed portion of the photosensitive layer occurs due to exposure to active rays, while at the same time, photopolymerizing and cross-linking reactions occur by incorporation of a photopolymerizable monomer that is bonded to the silicon gum layer in the upper layer. For this reason, in the exposed portion, the adhesive strength between the photosensitive layer and the silicon gum layer becomes stronger, so that an extremely strong fixing results. The cover film is removed following exposure, and the plate surface is wetted with the developing solution. The silicon gum layer swells in the developing solution. Only the unexposed portion of the silicon gum layer will peel away. This portion is removed by rubbing, thereby obtaining the printing plate.

In the preparation method for a printing plate of the present invention employing a negative water less planographic printing original plate and positive water less planographic printing original plate based on the preceding principle, image drawing is carried out by scan irradiating a high power blue laser having a wavelength that is 300 nm or more, but 370 nm or less. After soaking in a pre-treating solution having polypropylene glycol or polyethylene glycol as the main component, the image is developed by rubbing the plate surface with a revolving brush while washing. The printing plate is then obtained following drying. It is convenient, and therefore desirable, to employ an automatic processor for a water less printing plate that is capable of performing the series of developing steps at one time.

Note that when printing with a water less printing plate obtained in this way, the silicon gum layer on the surface becomes an ink repelling layer and will not receive ink. Rather, the ink image is formed on the areas where there is no silicon gum layer. In addition, the fountain solution that is employed in regular printing is not necessary here. Rather, a specialized ink is employed.

Other planographic printing original plates in which the present invention can be applied are the planographic printing original plates for water development or development on a printing machine that are currently being test marketed. Following exposure with active rays, the same developing treatment as employed for regular conventional plates is carried out on these planographic printing original plates for water development or development on a printing machine, however, only water is employed in the development treatment. Typically, these plates are mounted on the printing machine without carrying out a post-exposure developing treatment. Rather, the developing treatment, which employs fountain solution, is carried out immediately prior to printing. Namely, these planographic printing original plates for water development or development on a printing machine are planographic printing original plates for printing. Specific examples of this type of planographic printing original plate include Direct Print manufactured by Kodak Polychrome Graphics Company Ltd., and the printing plate disclosed in U.S. Pat. No. 5,616,449 by Polaroid Corp.; Japanese Patent Application, First Publication No. 9-136395 by Agfa-Gevaert; Japanese Patent Application, First Publication Nos. 9-50118, 9-80744, 9-218505, and 9-218506 by Toray Industries, Inc.; and Japanese Patent Application, Second Publication No. 6-77147 by Fuji Photo Film Co., Ltd.

In the preparation method for a printing plate of the present invention employing a planographic printing plate original plate for water development or development on a printing machine, image drawing is performed by scan irradiating with a high output blue laser having a wavelength of 300 nm or more, but less than 370 nm. The printing plate is then mounted on a printing machine without further treatment. It is also acceptable to perform developing in advance by using the plate cylinder pressure while soaking in fountain solution, and then printing without further treatment. Preparation of the printing plate is achieved by carrying out the same operations in a printing machine over 3 minutes as the operations performed in printing carried out while supplying fountain solution. In addition, printing can be carried out under the same conditions as employed in other printing plates.

Next, the present invention will be explained in greater detail using preferred embodiments thereof. However, the present invention is not limited to these examples.

EXAMPLE 1

A commercially available diazo-type negative PS plate RN2 (Kodak Polychrome Graphics Japan Ltd.) was attached to a vertical wall at a site 1 meter distant from the light source in a test room with yellow safety light, and was irradiated under various conditions with high output blue laser from a Compass Avia (wavelength 355 nm) manufactured by Coherent Japan Inc. The irradiated PS plate was then treated at 30° C. for 19 seconds in an automatic processor PD-912P (manufactured by Dainippon Screen MFG. Co., Ltd.) that was filled with a 1:3 dilution of developing solution ND1 (manufactured by Kodak Polychrome Graphics Japan Ltd.) and a 1:2 dilution of finishing gum NF2 (manufactured by Kodak Polychrome Graphics Japan Ltd.), to obtain printing plate 1.

The blue laser spots obtained on printing plate 1 had the characteristics as follows.

TABLE 1

| frequency | output | pulse number | diameter of spot |
| --- | --- | --- | --- |
| 15 kHz | 1.5 W | 100 | 2.8 mm |
| 15 kHz | 1.5 W | 500 | 3.0 mm |
| 60 kHz | 300 mW | 100 | None |
| 60 kHz | 300 mW | 500 | 1.0 mm |

The following was ascertained from the results of this example. The theoretical diameter of the spot irradiated by Compass Avia at a position 1 meter away is 2.7 mm. The theoretical value for the required power for this printing plate in the case of 100 pulses at 1.5 W can be calculated from the results of measurements of the spot diameter. Accordingly, the sensitivity of the plate surface of this printing plate was calculated to be 160 mJ/cm$^2$. In contrast, when the surface area irradiated with a Compass Avia blue laser light source from an optical system lens is contracted so that the size of one pixel is 14 micrometers, the irradiation power per unit surface area calculated from the irradiation surface area ratio becomes $3.7 \times 10^4$ times greater. The irradiation energy in a theoretical diameter per one pulse when blue laser light is output at 1.5 W from a Compass Avia is calculated to be 1.6 mJ/cm$^2$. Accordingly, when the irradiated surface area is contracted to 14 micrometers for the same light source power, a radiation energy of $5.92 \times 10^4$ mJ/cm$^2$ is obtained. Even when taking into consideration the power loss in an optical system, this exceeds the 160 mJ/cm$^2$ necessary for the printing plate RN2, and is sufficient for drawing one pixel with one pulse. On the other hand, when the oscillation time per pulse of the Compass Avia blue laser light source is 30~40 nanoseconds, and a 1080 mm×800 mm printing plate is scanned for an average of 35 nanoseconds per one pixel, then image writing can be completed in approximately 2.4 minutes. Accordingly, it was clear that there were no problems with respect to practical application.

Next, printing plate 1 was mounted on a printing machine (TOKO-820L, manufactured by Tokyo Koku Keiki KK.), and a printing test was carried out. The printing speed was 5,000 sheets/hour, the printing paper was Jujo Diacoat B4, the ink was GEOS-G magenta S (Dainippon Ink and Chemicals, Inc.), and the fountain solution was NA108W (1:50 dilution, manufactured by Dainippon Ink and Chemicals, Inc.). A 30,000 sheets printing test was performed. The 30,000 printed sheets obtained as a result where found to be excellent, demonstrating no problem with respect to quality.

EXAMPLE 2

A commercially available quinone diazide-type positive PS plate HP (Kodak Polychrome Graphics Japan Ltd.) was attached to a vertical wall at a site 1 meter distant from the light source in a test room with yellow safety light, and was irradiated under various conditions with high output blue laser from a Compass Avia (wavelength 355 nm) manufactured by Coherent Japan Inc. The irradiated PS plate was then treated at 30° C. for 12 seconds in an automatic processor PD-912P (manufactured by Dainippon Screen MFG. Co., Ltd.) that was filled with a 1:8 dilution of developing solution PD1 (manufactured by Kodak Polychrome Graphics Japan Ltd.) and a 1:2 dilution of finishing gum PF2 (manufactured by Kodak Polychrome Graphics Japan Ltd.), to obtain printing plate 2.

The blue laser spots obtained on printing plate 2 had the characteristics as follows.

TABLE 2

| frequency | output | pulse number | diameter of spot |
| --- | --- | --- | --- |
| 30 kHz | 1.0 W | 100 | 2.9 mm |
| 30 kHz | 1.0 W | 500 | 3.0 mm |
| 60 kHz | 300 mW | 100 | none |
| 60 kHz | 300 mW | 500 | 2.0 mm |

The following was ascertained from the results of this example. The theoretical diameter of the spot irradiated by Compass Avia at a position 1 meter away is 2.7 mm. The theoretical value for the required power for this printing plate in the case of 100 pulses at 1.0 W can be calculated from the results of measurements of the spot diameter. Accordingly, the sensitivity of the plate surface of this printing plate was calculated to be 50 mJ/cm$^2$. In contrast, when the surface area irradiated with a Compass Avia blue laser light source from an optical system lens is contracted so that the size of one pixel is 14 micrometers, the irradiation power per unit surface area calculated from the irradiation surface area ratio becomes $3.7 \times 10^4$ times greater. The irradiation energy in a theoretical diameter per one pulse when blue laser light is output at 1.0 W from a Compass Avia is calculated to be 0.5 mJ/cm$^2$. Accordingly, when the irradiated surface area is contracted to 14 micrometers for the same light source power, a radiation energy of $1.85 \times 10^4$ mJ/cm$^2$ is obtained. Even when taking into consideration the power loss in an optical system, this exceeds the 50 mJ/cm$^2$ necessary for the printing plate HP, and is sufficient for drawing one pixel with one pulse. On the other hand, when the oscillation time per pulse of the Compass Avia blue laser light source is 30~40 nanoseconds, and a 1080 mm×800 mm printing plate is scanned for an average of 35 nanoseconds per one pixel, then image writing can be completed in approximately 2.4 minutes. Accordingly, it was clear that there was no problem with respect to practical application.

Next, printing plate 2 was mounted on a printing machine (TOKO-820L, manufactured by Tokyo Koku Keiki KK.), and a printing test was carried out. The printing speed was 5,000 sheets/hour, the printing paper was Jujo Diacoat B4, the ink was GEOS-G magenta S (Dainippon Ink and Chemicals, Inc.), and the fountain solution was NA108W (1:50 dilution, manufactured by Dainippon Ink and Chemicals, Inc.). A 30,000 sheets printing test was performed. The 30,000 printed sheets obtained as a result where found to be excellent, demonstrating no problem with respect to quality.

As explained above, the preparation method for a printing plate of the present invention enables an image to be directly drawn stably and at low cost to a conventional planographic printing original plate that was manufactured for an application with active rays, by employing high density energy light that is scan irradiated according to digital information. As a result of this method, high resolution images can be reproduced easily.

The invention claimed is:

1. A preparation method for a printing plate in which an image is formed to a planographic printing original plate, comprising: (a) providing at least one photosensitive layer sensitive in the region of 300 nm~450 nm on a substrate, (b) scan irradiating the plate with high density energy light in the form of the image, wherein the output wavelength of the high density energy light is within the range of 300 nm to less than 370 nm, and the high density energy light is the second or third harmonic obtained from a solid-state semiconductor laser or optically pumped semiconductor laser, and (c) performing wet development and a post-treatment of the plate.

2. The method of claim 1, wherein the high density energy light source has a power output of at least 300 mW.

3. The method of claim 1, wherein the high density energy light source has a power output of at least 1 W.

4. The method of claim 1, wherein the planographic printing original plate is a negative photosensitive planographic printing original plate in which the printing plate image is formed by applying active rays and then becoming insoluble in an alkaline developing solution.

5. The method of claim 4, wherein the negative photosensitive planographic printing original plate is a plate in which one or more photosensitive layers are provided on a substrate, and the photosensitive layers comprise a photosensitive composition consisting of a photosensitive diazo resin and a binder resin.

6. The method of claim 1, wherein the planographic printing original plate is a positive photosensitive planographic printing original plate in which the printing plate image is formed by applying active rays and then becoming soluble in an alkaline developing solution.

7. The method of claim 6, wherein the positive photosensitive planographic printing original plate is a plate in which one or more photosensitive layers are provided on a substrate, and the photosensitive layers comprise a photosensitive composition consisting of a photosensitive o-quinone diazide compound.

8. The method of claim 1, wherein the planographic printing original plate is a waterless planographic printing original plate in which a photosensitive layer is provided on a substrate, and the photosensitive layer includes a photosensitive substance that is responsive to light in the 300 to 450 nm range.

9. The method of claim 1, wherein the high density energy light is generated by exciting the semiconductor laser with energy of a wavelength in the range of 600 nm to less than 740 nm to produce the second harmonic.

10. The method of claim 1, wherein the high density energy light is generated by exciting the semiconductor laser with energy of a wavelength in the range of 900 nm to less than 1110 nm to produce the third harmonic.

11. The method of claim 1, wherein the high density energy light is generated by exciting the semiconductor laser with energy of a wavelength in the range of 600 nm to less than 740 nm to produce the second harmonic obtained from an optically pumped semiconductor laser.

12. The method of claim 1, wherein the high density energy light is generated by exciting the semiconductor laser with energy of a wavelength in the range of 900 nm to less than 1110 nm to produce the third harmonic obtained from an optically pumped semiconductor laser.

13. The method of claim 1, wherein the high density energy light is continuous.

14. The method of claim 1, wherein the high density energy light is pulsed.

15. The method of claim 1, wherein the printing plate is a negative photosensitive plate.

16. The method of claim 15, wherein the photosensitive layer comprises a photosensitive diazo resin and a binder resin.

17. The method of claim 15, wherein the photosensitive layer comprises a photo cross-linking agent.

18. The method of claim 15, wherein the photosensitive layer comprises an addition polymerizable unsaturated compound and a photopolymerization initiator.

19. The method of claim 15, wherein the substrate is rendered hydrophilic prior to application of the photosensitive layer.

20. The method of claim 1, wherein the printing plate is a positive photosensitive plate.

21. The method of claim 20, wherein the substrate is rendered hydrophilic prior to application of the photosensitive layer.

22. The method of claim 20, wherein the photosensitive layer comprises at least one compound selected from the group consisting of o-quinone diazide compounds, acid-decomposable ether compounds, and acid-decomposable ester compounds.

23. The method of claim 20, wherein the photosensitive layer comprises at least one o-quinone diazide compound and at least one alkali soluble resin.

24. The method of claim 23, wherein the alkali soluble resin is selected from the group consisting of novolak phenol resins, polyvinyl phenol resins and combinations thereof.

25. The method of claim 1, wherein the printing plate is a waterless planographic printing plate comprising a photosensitive layer, a silicon gum layer and a cover film layer applied sequentially to the substrate.

* * * * *

UNITED STATES PATENT AND TRADEMARK OFFICE
CERTIFICATE OF CORRECTION

PATENT NO.     : 6,426,173 B1
DATED          : July 30, 2002
INVENTOR(S)    : Shinji Shimizu et al.

It is certified that error appears in the above-identified patent and that said Letters Patent is hereby corrected as shown below:

<u>Title page,</u>
Insert the following: -- Related Application Data
[63] United States National Stage Application of PCT/JP00/00312, filed on Jan. 24, 2000. --

Signed and Sealed this

First Day of April, 2003

JAMES E. ROGAN
*Director of the United States Patent and Trademark Office*